US010115344B2

(12) United States Patent
Chung

(10) Patent No.: US 10,115,344 B2
(45) Date of Patent: Oct. 30, 2018

(54) PIXEL CIRCUIT AND LIGHT EMITTING DISPLAY DEVICE

(71) Applicant: EverDisplay Optronics (Shanghai) Limited, Shanghai (CN)

(72) Inventor: Ming Ta Chung, Shanghai (CN)

(73) Assignee: EverDisplay Optronics (Shanghai) Limited, Shanghai (CN)

( * ) Notice: Subject to any disclaimer, the term of this patent is extended or adjusted under 35 U.S.C. 154(b) by 13 days.

(21) Appl. No.: 15/522,072

(22) PCT Filed: Oct. 27, 2014

(86) PCT No.: PCT/CN2014/089571
§ 371 (c)(1),
(2) Date: Apr. 26, 2017

(87) PCT Pub. No.: WO2016/065508
PCT Pub. Date: May 6, 2016

(65) Prior Publication Data
US 2017/0358259 A1 Dec. 14, 2017

(51) Int. Cl.
*G09G 3/3233* (2016.01)
*H01L 51/50* (2006.01)
*H01L 27/32* (2006.01)
(52) U.S. Cl.
CPC ....... *G09G 3/3233* (2013.01); *H01L 27/3244* (2013.01); *H01L 51/50* (2013.01)
(58) Field of Classification Search
None
See application file for complete search history.

(56) References Cited

U.S. PATENT DOCUMENTS

| 2004/0239600 A1 | 12/2004 | Lin |
| 2009/0140957 A1 | 6/2009 | Park et al. |
| 2011/0115764 A1 | 5/2011 | Chung |

FOREIGN PATENT DOCUMENTS

| CN | 1909043 A | 2/2007 |
| CN | 101192373 A | 6/2008 |

OTHER PUBLICATIONS

ISR dated Jul. 20, 2015 by WIPO.

*Primary Examiner* — Chad Dicke
(74) *Attorney, Agent, or Firm* — Yunling Ren

(57) ABSTRACT

A pixel circuit includes: a light emitting component, a first transistor (MT2) including a gate coupled to a first node (N1), a first terminal coupled to a first pixel power supply (VELVDD) and a second terminal coupled to a second node (N3), and the pixel current flows from the first terminal to the second terminal in response to a voltage at the gate; a second transistor (MT1), for selectively providing a data signal to a third node (N2); a third transistor (MT3); a fourth transistor (MT6), for selectively providing a compensation voltage to the first transistor (MT2); a fifth transistor (MT5), for selectively providing an initialization voltage to the third node (N2); a sixth transistor (MT4), for selectively providing the pixel current to the light emitting component; and a capacitor (C1), located between the first node (N1) and the third node (N2).

12 Claims, 7 Drawing Sheets

PIXEL CIRCUIT AND LIGHT EMITTING DISPLAY DEVICE

CROSS REFERENCE TO RELATED APPLICATION

This application is a US national phase of International Application No. PCT/CN2014/089571 filed Oct. 27, 2014, the entire contents of which are incorporated herein by reference.

TECHNICAL FIELD

The present disclosure relates to a pixel circuit and a light emitting display device using the same, and more particularly to a pixel circuit and a light emitting display device suitable for use in high resolution.

BACKGROUND

With the development of technology, organic materials have been widely used in a variety of circuit components. For instance, an organic light-emitting display (OLED) made of organic materials is gradually paid more attention in the display market due to its simple structure, excellent working temperature, contrast and viewing angle, its rectifying and light-emitting characteristics as light-emitting diodes (LED), and other advantages.

In general, the current flowing through the organic light emitting diode in the organic light emitting diode display panel not changes only as the conduction voltage of the organic light emitting diode changes over a long period of time, but also varies based on threshold voltage drift of the thin film transistor for driving the organic light emitting diode is different. Thus, the brightness uniformity and brightness constant of the organic light emitting diode display may be affected, and the application thereof in high resolution organic light emitting diode displays may be in turn affected.

SUMMARY

The present disclosure is directed to provide a pixel structure and a display apparatus so as to solve those problems in related art.

In order to achieve above objects, the pixel circuit according to the disclosure includes:
a light emitting component configured to emit light by receiving a pixel current flowing from a first pixel power supply to a second pixel power supply;
a first transistor including a gate coupled to a first node, a first terminal coupled to the first pixel power supply and a second terminal coupled to a second node, the pixel current flowing from the first terminal to the second terminal in response to a voltage at the gate;
a second transistor configured to selectively provide a data signal to a third node;
a third transistor configured to selectively couple the gate of the first transistor to the second terminal of the first transistor;
a fourth transistor configured to selectively provide a compensation voltage to the first transistor;
a fifth transistor configured to selectively provide an initialization voltage to the third node;
a sixth transistor configured to selectively provide the pixel current to the light emitting component; and
a capacitor located between the first node and the third node.

In an embodiment, turn-on and turn-off of the second transistor and turn-on and turn-off of the third transistor are determined by a first signal; turn-on and turn-off of the fourth transistor are determined by a second signal; and turn-on and turn-off of the fifth transistor and turn-on and turn-off of the sixth transistor are determined by a light emission control signal.

In an embodiment, the second transistor includes:
a gate coupled to a supply terminal of the first signal;
a first terminal coupled to a supply terminal of the data signal; and
a second terminal coupled to the third node.

In an embodiment, the third transistor includes:
a gate coupled to the supply terminal of the first signal;
a first terminal coupled to the first node; and
a second terminal coupled to the second node.

In an embodiment, the third transistor includes a first sub-transistor and a second sub-transistor, the first sub-transistor and the second sub-transistor each includes a gate, a first terminal and a second terminal, the gate of the first sub-transistor and the gate of the second sub-transistor are coupled to the supply terminal of the first signal, the first terminal of the first sub-transistor is coupled to the first node, the second terminal of the first sub-transistor is coupled to the first terminal of the second sub-transistor, the second terminal of the second sub-transistor is coupled to the second node.

In an embodiment, the fourth transistor includes:
a gate coupled to a supply terminal of the second signal;
a first terminal coupled to a terminal of a compensation power supply configured to supply the compensation voltage; and
a second terminal coupled to the third node.

In an embodiment, the fifth transistor includes:
a gate coupled to a supply terminal of the light emission control signal;
a first terminal coupled to a terminal of an initialization power supply configured to supply the initialization voltage; and
a second terminal coupled to the third node.

In an embodiment, the light emitting component includes a light emitting diode having an anode and a cathode.

In an embodiment, the sixth transistor includes:
a gate coupled to the supply terminal of the light emission control signal;
a first terminal coupled to the anode of the light emitting diode; and
a second terminal coupled to the second node.

In an embodiment, the cathode of the light emitting diode is coupled to the second pixel power supply.

In an embodiment, at least one of the first transistor, the second transistor, the third transistor, the fourth transistor, the fifth transistor, and the sixth transistor includes a P-type transistor or an N-type transistor.

In an embodiment, the fourth transistor includes:
a gate coupled to a supply terminal of the second signal;
a first terminal coupled to the supply terminal of the second signal; and
a second terminal coupled to the third node.

In an embodiment, a driving timing of the pixel circuit includes:
in a first time period, the first signal and the light emission control signal are at high level, and the second signal is at low level; the second transistor, the third transistor, the fifth transistor, and the sixth transistor are turned off, and the first transistor, the second transistor, and the fourth transistor are turned on;

in a second time period, the first signal is at low level, the second signal and the light emission control signal are at high level; the fourth transistor, the fifth transistor and the sixth transistor are turned off, and the first transistor, the second transistor, and the third transistor are turned on; and in a third time period, the first signal and the second signal are at high level, and the light emission control signal is at low level; the second transistor, the third transistor and the fourth transistor are turned off, and the first transistor, the fifth transistor, and the sixth transistor are turned on.

In an embodiment, a driving timing of the pixel circuit includes:

in a first time period, the first signal and the light emission control signal are at low level, and the second signal is at high level; the second transistor, the third transistor, the fifth transistor, and the sixth transistor are turned off, and the first transistor, the second transistor, and the fourth transistor are turned on;

in a second time period, the first signal is at high level, the second signal and the light emission control signal are at low level; the fourth transistor, the fifth transistor and the sixth transistor are turned off, and the first transistor, the second transistor, and the third transistor are turned on; and in a third time period, the first signal and the second signal are at low level, and the light emission control signal is at high level; the second transistor, the third transistor and the fourth transistor are turned off, and the first transistor, the fifth transistor, and the sixth transistor are turned on.

There is also provided a light emitting display device according to the disclosure, including:

a pixel cell including multiple pixels and a pixel circuit of the pixels;

a data driving element configured to supply a data signal to the pixels;

a power supply element configured to supply a first pixel power supply, a second pixel power supply, a compensation power supply, and an initialization power supply to the pixels; and a scan driving element configured to selectively supply the data signal, the first pixel power supply, the second pixel power supply, the compensation power supply, and the initialization power supply to the pixels so as to enable a pixel current corresponding to the data signal to flow to the pixels;

wherein the pixel circuit includes:

a light emitting component configured to emit light by receiving a pixel current flowing from a first pixel power supply to a second pixel power supply;

a first transistor including a gate coupled to a first node, a first terminal coupled to the first pixel power supply and a second terminal coupled to a second node, the pixel current flowing from the first terminal to the second terminal in response to a voltage at the gate;

a second transistor configured to selectively provide the data signal to a third node;

a third transistor configured to selectively couple the gate of the first transistor to the second terminal of the first transistor;

a fourth transistor configured to selectively provide a compensation voltage supplied by the compensation power supply to the first transistor;

a fifth transistor configured to selectively provide an initialization voltage supplied by the initialization power supply to the third node;

a sixth transistor configured to selectively provide the pixel current to the light emitting component; and a capacitor located between the first node and the third node.

In an embodiment, turn-on and turn-off of the second transistor and turn-on and turn-off of the third transistor are determined by a first signal; turn-on and turn-off of the fourth transistor are determined by a second signal; and turn-on and turn-off of the fifth transistor and turn-on and turn-off of the sixth transistor are determined by a light emission control signal.

In an embodiment, the second transistor includes:
a gate coupled to a supply terminal of the first signal;
a first terminal coupled to a supply terminal of the data signal; and
a second terminal coupled to the third node.

In an embodiment, the third transistor includes:
a gate coupled to the supply terminal of the first signal;
a first terminal coupled to the first node; and
a second terminal coupled to the second node.

In an embodiment, the third transistor includes a first sub-transistor and a second sub-transistor, the first sub-transistor and the second sub-transistor each includes a gate, a first terminal and a second terminal, the gate of the first sub-transistor and the gate of the second sub-transistor are coupled to the supply terminal of the first signal, the first terminal of the first sub-transistor is coupled to the first node, the second terminal of the first sub-transistor is coupled to the first terminal of the second sub-transistor, the second terminal of the second sub-transistor is coupled to the second node.

In an embodiment, the fourth transistor includes:
a gate coupled to a supply terminal of the second signal;
a first terminal coupled to a terminal of the compensation power supply configured to supply the compensation voltage; and
a second terminal coupled to the third node.

In an embodiment, the fifth transistor includes:
a gate coupled to a supply terminal of the light emission control signal;
a first terminal coupled to a terminal of the initialization power supply configured to supply the initialization voltage; and
a second terminal coupled to the third node.

In an embodiment, the light emitting component includes a light emitting diode having an anode and a cathode.

In an embodiment, the sixth transistor includes:
a gate coupled to the supply terminal of the light emission control signal;
a first terminal coupled to the anode of the light emitting diode; and
a second terminal coupled to the second node.

In an embodiment, the cathode of the light emitting diode is coupled to the second pixel power supply.

In an embodiment, at least one of the first transistor, the second transistor, the third transistor, the fourth transistor, the fifth transistor, and the sixth transistor includes a P-type transistor or an N-type transistor.

In an embodiment, the fourth transistor includes:
a gate coupled to a supply terminal of the second signal;
a first terminal coupled to the supply terminal of the second signal; and
a second terminal coupled to the third node.

In an embodiment, a driving timing of the pixel circuit includes:

in a first time period, the first signal and the light emission control signal are at high level, and the second signal is at low level; the second transistor, the third transistor, the fifth transistor, and the sixth transistor are turned off, and the first transistor, the second transistor, and the fourth transistor are turned on;

in a second time period, the first signal is at low level, the second signal and the light emission control signal are at high level; the fourth transistor, the fifth transistor and the sixth transistor are turned off, and the first transistor, the second transistor, and the third transistor are turned on; and in a third time period, the first signal and the second signal are at high level, and the light emission control signal is at low level; the second transistor, the third transistor and the fourth transistor are turned off, and the first transistor, the fifth transistor, and the sixth transistor are turned on.

In an embodiment, a driving timing of the pixel circuit includes:

in a first time period, the first signal and the light emission control signal are at low level, and the second signal is at high level; the second transistor, the third transistor, the fifth transistor, and the sixth transistor are turned off, and the first transistor, the second transistor, and the fourth transistor are turned on;

in a second time period, the first signal is at high level, the second signal and the light emission control signal are at low level; the fourth transistor, the fifth transistor and the sixth transistor are turned off, and the first transistor, the second transistor, and the third transistor are turned on; and in a third time period, the first signal and the second signal are at low level, and the light emission control signal is at high level; the second transistor, the third transistor and the fourth transistor are turned off, and the first transistor, the fifth transistor, and the sixth transistor are turned on.

According to the pixel circuit of the present disclosure, the driving transistor can be kept at a low voltage during the initial stage and the current flowing through the driving transistor is enabled to be independent of the first pixel power supply coupled thereto.

DETAILED DESCRIPTION

The embodiments described below constitute part of the present disclosure, rather than all of embodiments. The equivalent variations and modifications of the present disclosure made based on the described embodiments thereof should fall within the scope of the present disclosure.

The terms "first", "second" and similar words used in the application document of the present disclosure do not denote any order or quantity, but only for distinguishing between different constituent parts. In addition, the term "coupling" refers not only to the fact that one element is directly connected to another element, but also means that one element is indirectly connected another element through the third element.

According to an embodiment of the disclosure, there is provided a pixel circuit, including:

a light emitting component configured to emit light by receiving a pixel current flowing from a first pixel power supply to a second pixel power supply;

a first transistor comprising a gate coupled to a first node, a first terminal coupled to the first pixel power supply and a second terminal coupled to a second node, the pixel current flowing from the first terminal to the second terminal in response to a voltage at the gate;

a second transistor configured to selectively provide a data signal to a third node;

a third transistor configured to selectively couple the gate of the first transistor to the second terminal of the first transistor;

a fourth transistor configured to selectively provide a compensation voltage to the first transistor;

a fifth transistor configured to selectively provide an initialization voltage to the third node;

a sixth transistor configured to selectively provide the pixel current to the light emitting component; and a capacitor located between the first node and the third node.

According to the disclosure, storage of both a data voltage and a compensation voltage can be achieved by using one capacitor, where the compensation voltage is stored in a first time period T1 and the data voltage is stored in a second time period T2. Thus, as a space of high resolution product is limited, advantages of the high resolution product can be enabled, and yield of production can be improved. According to the pixel circuit of the present disclosure, the driving transistor can be kept at a low voltage during the initial stage and the current flowing through the driving transistor is enabled to be independent of the first pixel power supply coupled thereto.

Figure 1A:
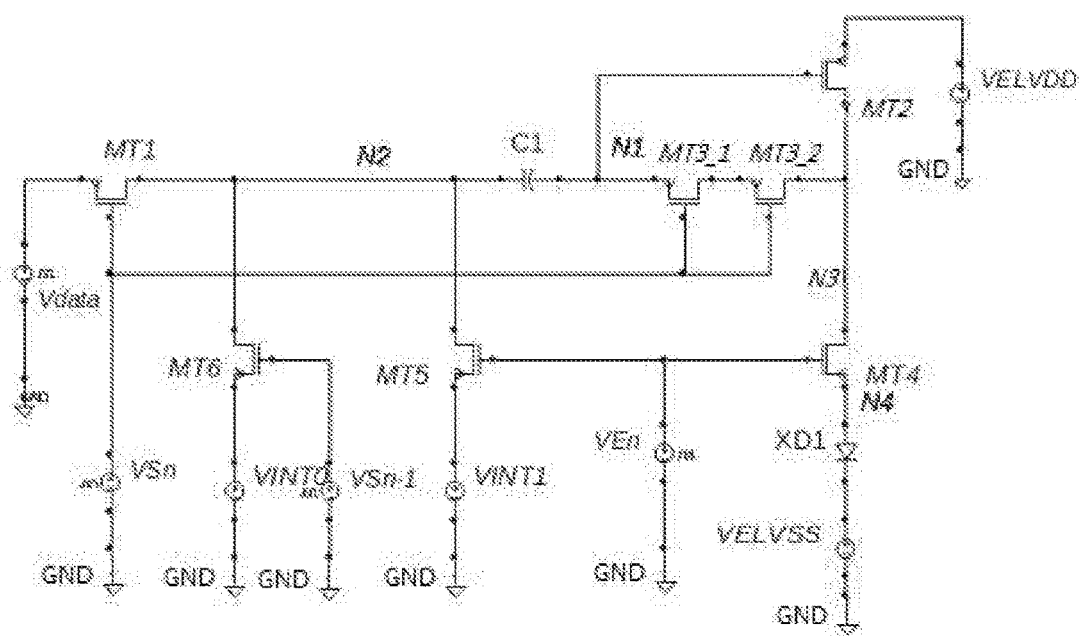
FIG. 1A is a schematic diagram illustrating the pixel circuit according to an embodiment of the disclosure.
Figure 1B:
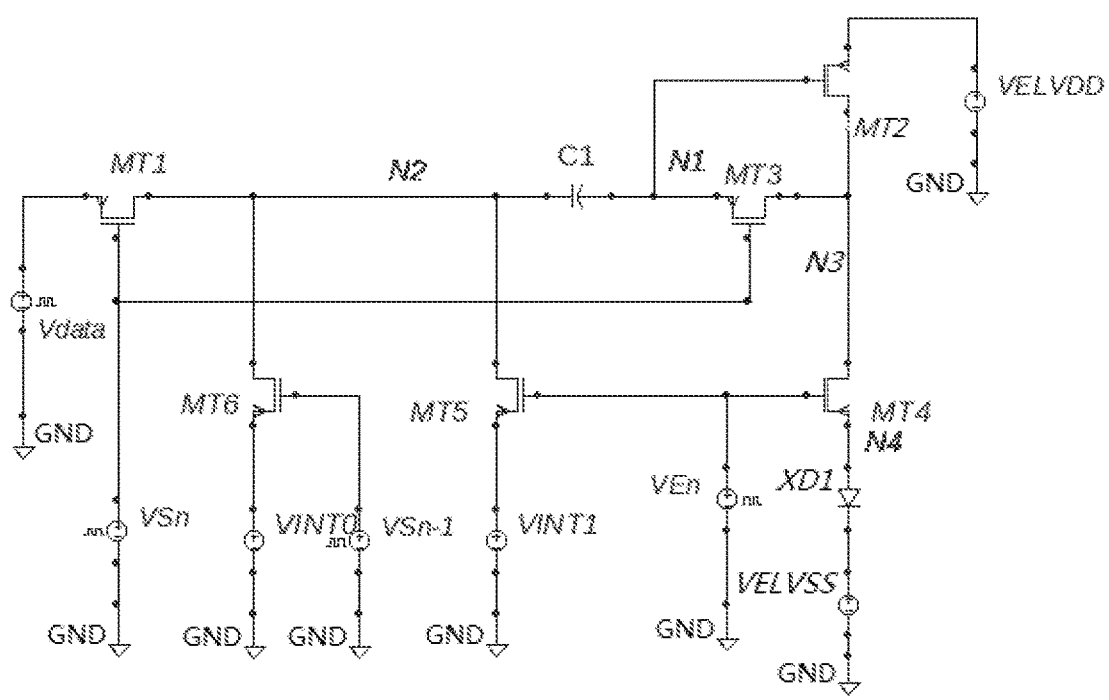
FIG. 1B is a schematic diagram illustrating the pixel circuit according to another embodiment of the disclosure.

In an embodiment, as shown in FIG. 1A, the pixel circuit of the present disclosure includes a first transistor MT2, a second transistor MT1, a third transistor MT3, a fourth transistor MT6, a fifth transistor MT5, a sixth transistor MT4, a capacitance C1 and a light emitting element XD1; a gate of the first transistor MT2 is coupled to the first node N1, a source of the first transistor MT2 is coupled to the second node N3, a drain of the first transistor MT2 is coupled to an end of the first pixel power supply VELVDD, the other end of the first pixel power supply VELVDD is coupled to a ground terminal; a gate of the second transistor MT1 is coupled to a gate of the third transistor MT3 and an end of a supply terminal VSn of the first signal, the other end of the supply terminal VSn of the first signal is coupled to the ground terminal, a drain of the second transistor MT1 is coupled to an end of a supply terminal Vdata of the data signal, the other end of the supply terminal Vdata of the data signal is coupled to the ground terminal, a source of the second transistor MT1 is coupled to the third node N2; the third transistor MT3 includes a first sub-transistor MT3_1 and a second sub-transistor MT3_2, both a gate of the first sub-transistor MT3_1 and a gate of the second sub-transistor MT3_2 are coupled to an end of the supply terminal VSn of the first signal, a drain of the first sub-transistor MT3_1 is coupled to the first node N1, a source of the first sub-transistor MT3_1 is coupled to a drain of the second sub-transistor MT3_2, a source of the second sub-transistor MT3_2 is coupled to the second node N3. The third transistor MT3 in the embodiment including two sub-transistors is provided in consideration of that the leakage current control is better with two sub-transistors in closing period of the module. In other cases such as the pixel space is insufficient or the device characteristic is excellent, however, only one transistor may be used (as shown in FIG. 1B). A gate of the fourth transistor MT6 is coupled to an end of a supply terminal VSn−1 of the second signal, the other end of the supply terminal VSn−1 of the second signal is coupled to the ground terminal, a source of the fourth transistor MT6 is coupled to the third node N2, a drain of the fourth transistor MT6 is coupled to an end of a compensation power supply VINT0 supplying the compensation voltage, the other end of the compensation power supply VINT0 is coupled to the ground terminal; a source of the fifth transistor MT5 is coupled to the third node N2, a drain of the fifth transistor MT5 is coupled to an end of an initialization power supply VINT1 supplying the initialization voltage, the other end of the initialization power supply VINT1 is coupled to the ground terminal; a gate of the sixth transistor MT4 is coupled to a gate of the fifth transistor MT5 and an end of a supply terminal VEn of the light emission control signal; the other end of the supply terminal VEn of the light emission control signal is coupled to the ground terminal, a source of the sixth transistor MT4 is coupled to the second node N3, a drain of the sixth transistor MT4 is coupled to an anode of the light emitting element XD1, a cathode of the light emitting element XD1 is coupled to an end of a second pixel power supply VELVSS, the other end of the second pixel power supply VELVSS is coupled to the ground terminal; an end of the capacitor C1 is coupled to the third node N2, and the other end of the capacitor C1 is coupled to the first node N1.

In another embodiment, as shown in FIG. 1B, the pixel circuit of the present disclosure includes a first transistor MT2, a second transistor MT1, a third transistor MT3, a fourth transistor MT6, a fifth transistor MT5, a sixth transistor MT4, a capacitance C1 and a light emitting element XD1; a gate of the first transistor MT2 is coupled to the first node N1, a source of the first transistor MT2 is coupled to the second node N3, a drain of the first transistor MT2 is coupled to an end of the first pixel power supply VELVDD, the other end of the first pixel power supply VELVDD is coupled to a ground terminal; a gate of the second transistor MT1 is coupled to a gate of the third transistor MT3 and an end of a supply terminal VSn of the first signal, the other end of the supply terminal VSn of the first signal is coupled to the ground terminal, a drain of the second transistor MT1 is coupled to an end of a supply terminal Vdata of the data signal, the other end of the supply terminal Vdata of the data signal is coupled to the ground terminal, a source of the second transistor MT1 is coupled to the third node N2; a gate of the third transistor MT3 is coupled to an end of the supply terminal VSn of the first signal, a drain of the third transistor MT3 is coupled to the first node N1, and a source of the third transistor MT3 is coupled to the second node N3. A gate of the fourth transistor MT6 is coupled to an end of a supply terminal VSn−1 of the second signal, the other end of the supply terminal VSn−1 of the second signal is coupled to the ground terminal, a source of the fourth transistor MT6 is coupled to the third node N2, a drain of the fourth transistor MT6 is coupled to an end of a compensation power supply VINT0 supplying the compensation voltage, the other end of the compensation power supply VINT0 is coupled to the ground terminal; a source of the fifth transistor MT5 is coupled to the third node N2, a drain of the fifth transistor MT5 is coupled to an end of an initialization power supply VINT1 supplying the initialization voltage, the other end of the initialization power supply VINT1 is coupled to the ground terminal; a gate of the sixth transistor MT4 is coupled to a gate of the fifth transistor MT5 and an end of a supply terminal VEn of the light emission control signal; the other end of the supply terminal VEn of the light emission control signal is coupled to the ground terminal, a source of the sixth transistor MT4 is coupled to the second node N3, a drain of the sixth transistor MT4 is coupled to an anode of the light emitting element XD1, a cathode of the light emitting element XD1 is coupled to an end of a second pixel power supply VELVSS, the other end of the second pixel power supply VELVSS is coupled to the ground terminal; an end of the capacitor C1 is coupled to the third node N2, and the other end of the capacitor C1 is coupled to the first node N1.

Figure 2:
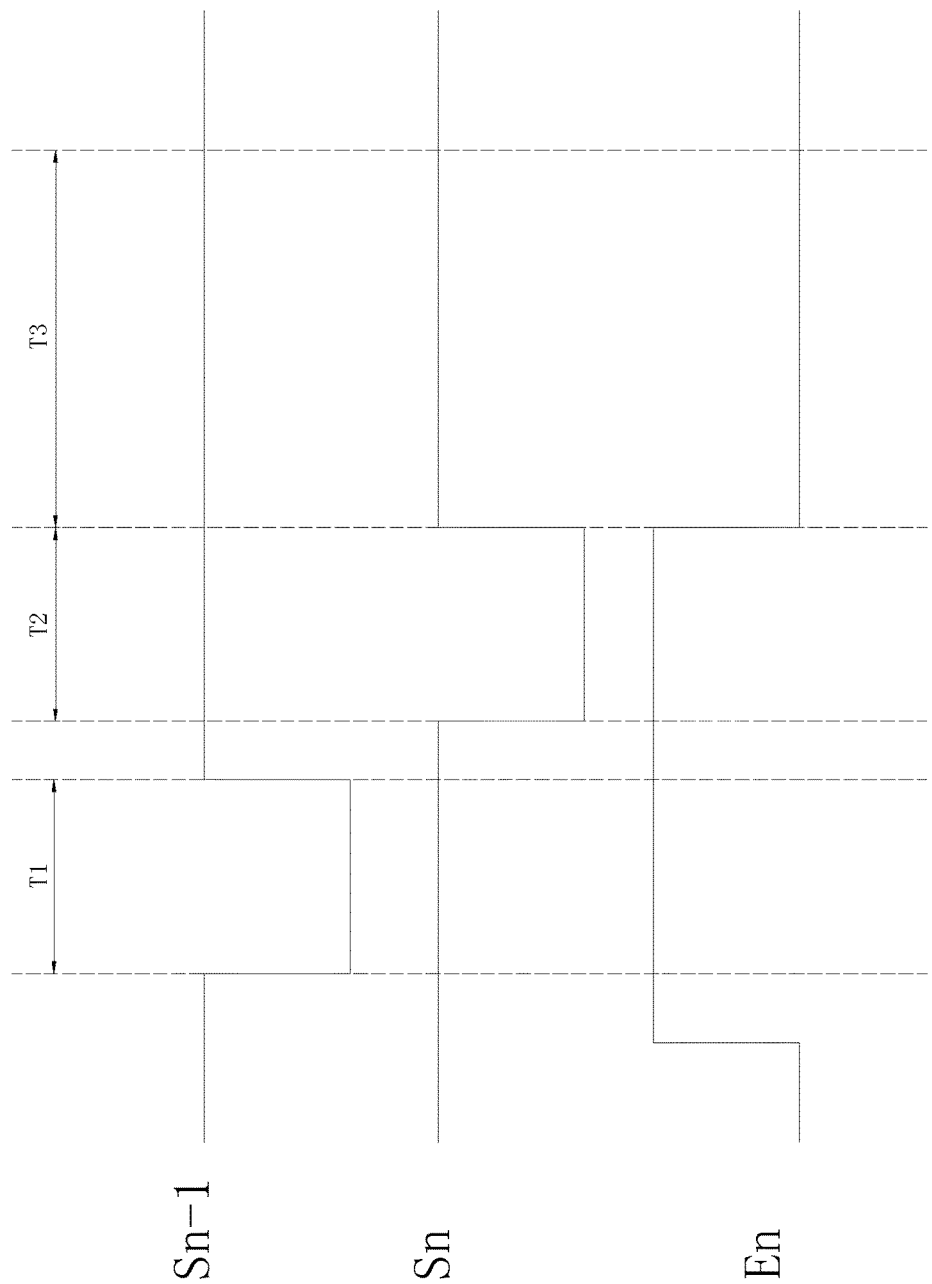
FIG. 2 is a timing chart illustrating a driving signal of the pixel circuit according to an embodiment of the disclosure.

FIG. 2 is a timing chart illustrating driving of the pixel circuit. As shown in FIG. 2, the signal input to the pixel circuit includes a first signal Sn, a second signal Sn−1 and a light emission control signal En, in which a fixed pitch may be kept between the first signal Sn and the second signal Sn−1.

Figure 3A:
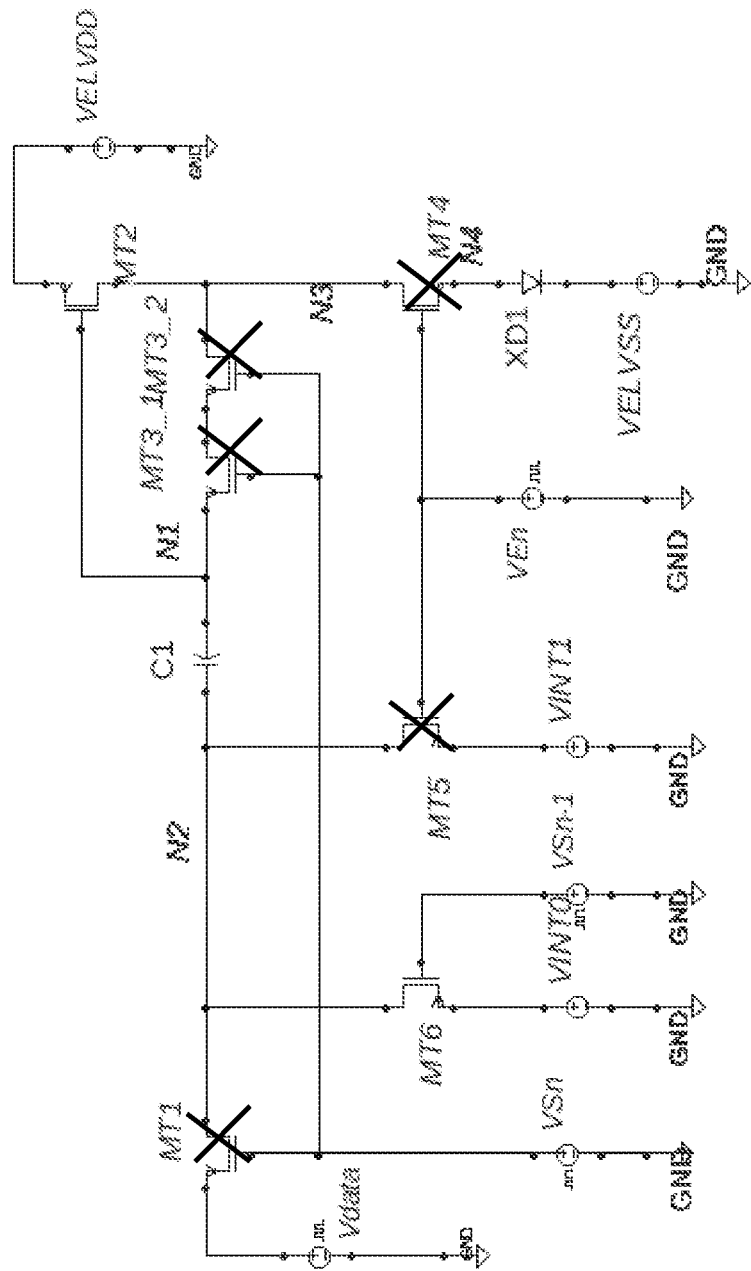
FIGS. 3A-3C are schematic diagrams illustrating a driving method of the pixel circuit according to an embodiment of the disclosure.

In a first time period T1, the second signal Sn−1 is at low level, and the first signal Sn and the light emission control signal En are at high level. Thus, driving operations of the pixel circuit in this time period, as shown in FIG. 3A, may be described as follows. The second transistor MT1, the first sub-transistor MT3_1, the second sub-transistor MT3_2, the sixth transistor MT4 and the fifth transistor MT5 are turned off, and the first transistor MT2 and the fourth transistor MT6 are turned on. Since the pixel circuit of the present disclosure is of a P-type transistor architecture, in order to ensure that the pixel circuit operates normally at an initial stage, the gate of the driving transistor is maintained at a low voltage in the initial stage, the compensation voltage VINT0 is provided to the third node N2, and a first node potential VN1 is set to less than VELVDD-Vth.

Figure 3B:
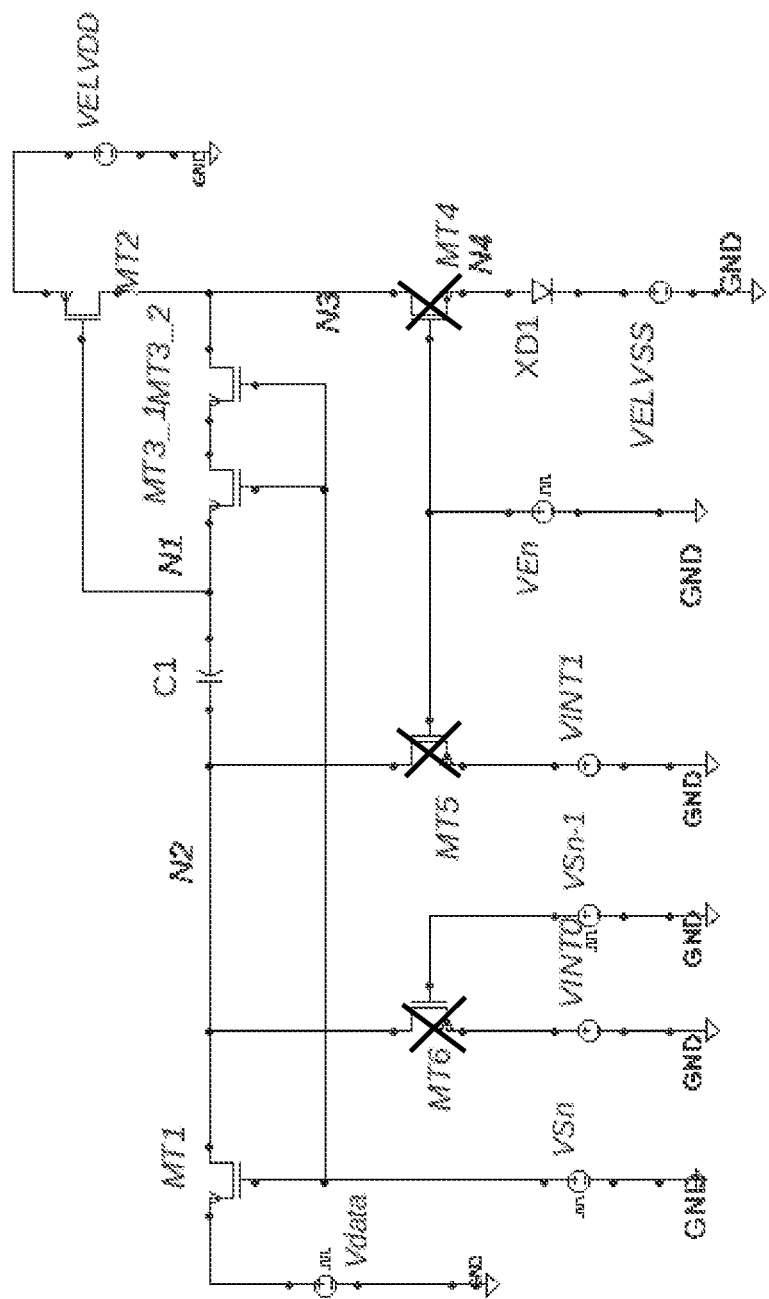

In a second time period T2, the second signal Sn−1 is at high level, the first signal Sn is at low level, and the light emission control signal En is at high level. Thus, driving operations of the pixel circuit in this time period, as shown in FIG. 3B, may be described as follows. The fourth transistor MT6, the fifth transistor MT5 and the sixth transistor MT4 are turned off, and the first transistor MT2, the second transistor MT1, the first sub-transistor MT3_1 and the second sub-transistor MT3_2 are turned on. When the second transistor MT1 is turned on, the data signal Vdata is provided to the third node N2, and the first node potential VN1 is set to VELVDD-Vth.

Figure 3C:
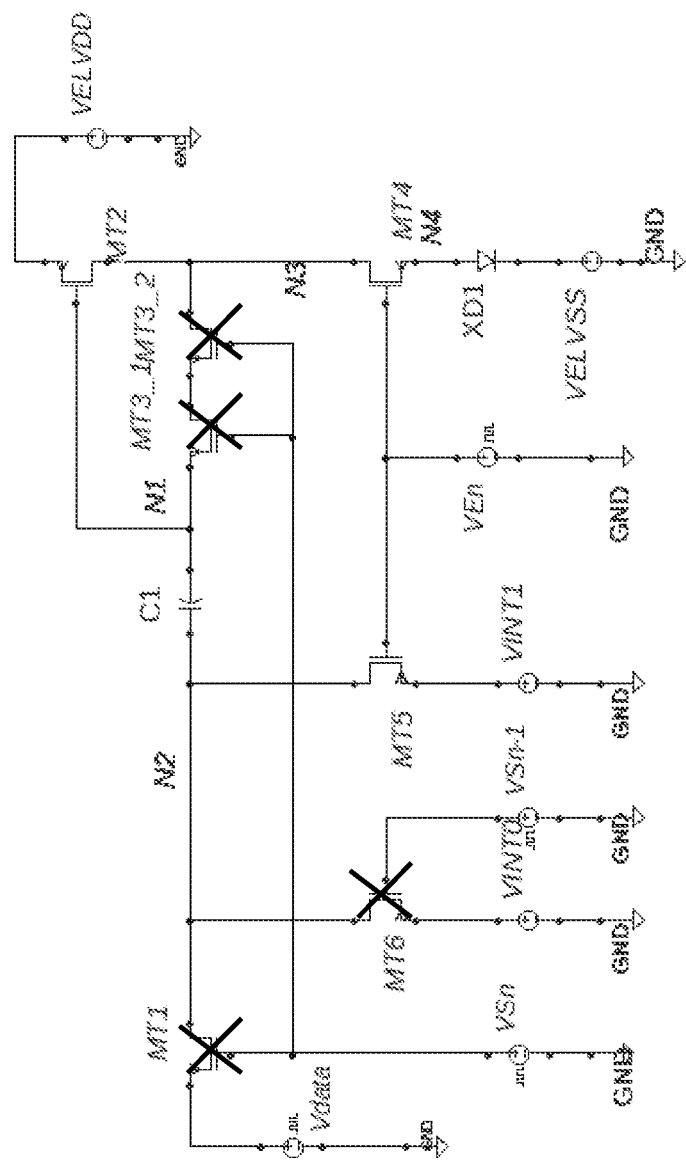

In a third time period T3, the second signal Sn−1 is at high level, the first signal Sn is at high level, and the light emission control signal En is at low level. Thus, driving operations of the pixel circuit in this time period, as shown in FIG. 3C, may be described as follows. The second transistor MT1, the first sub-transistor MT3_1, the second sub-transistor MT3_2, and the fourth transistor MT6 are turned off, and the first transistor MT2, the fifth transistor MT5 and the sixth transistor MT4 are turned on. At this moment, a potential VN2 of the third node N2 is at an initial voltage VINT1, and the potential VN1 of the first node N1 is at (ELVDD-Vth)−(Vdata-VINT1). Accordingly, in the third time period, a driving current Ioled generated by the first transistor MT2 may be expressed as follows.

$$I_{oled} = K(Vgs - Vth)^2 == K(ELVDD - VN1 - Vth)^2$$

$$= K\{ELVDD - [(ELVDD - Vth) + (Data - VINT1)] - Vth\}^2$$

$$= K(Data - VINT1)^2$$

Herein, K is a current constant of the first transistor MT2, Vgs is a gate voltage of the first transistor MT2.

In the present embodiment, the first transistor MT2, the second transistor MT1, the third transistor MT3, the fourth transistor MT6, the fifth transistor MT5, and the sixth transistor MT4 are described by taking a P-type transistor as an example. However, the present disclosure is not limited thereto. The first transistor MT2, the second transistor MT1, the third transistor MT3, the fourth transistor MT6, the fifth transistor MT5, and the sixth transistor MT4 may be alternatively provided as an N-type transistor, and the timing chart illustrating the driving of the pixel circuit shown in FIG. 2 may be modified as follows. In the first period, the second signal Sn−1 is at high level, the first signal Sn is at low level, and the light emission control signal En is at low level. In the second time period, the second signal Sn−1 is at low level, the first signal Sn is at high level, and the light emission control signal En is at low level. In the third time period, the second signal Sn−1 is at low level, the first signal Sn is at low level, and the light emission control signal En is at high level. Nevertheless, the driving states of the first transistor MT2, the second transistor MT1, the third transistor MT3, the fourth transistor MT6, the fifth transistor MT5, and the sixth transistor MT4 may not change at each time period, and still, may be the same as described in the above embodiment, which not repeated herein.

Figure 4:
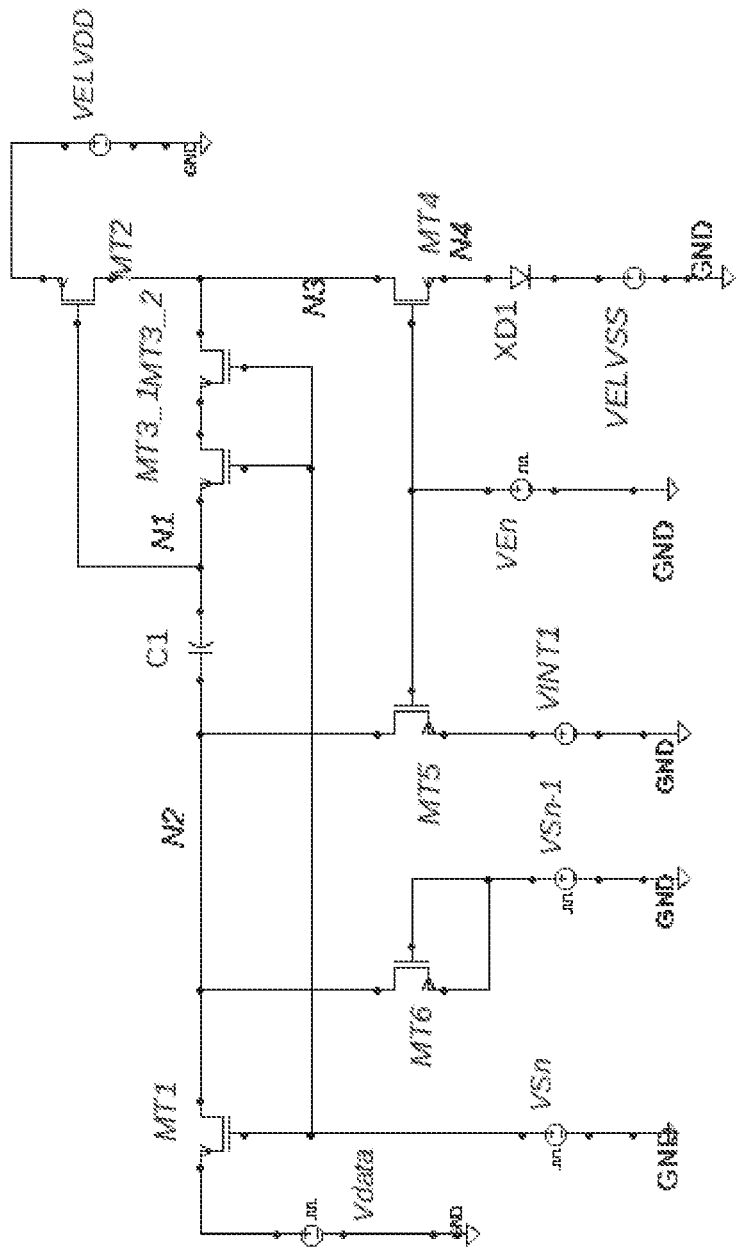
FIG. 4 is a schematic diagram illustrating the pixel circuit according to another embodiment of the disclosure.

In another embodiment, as shown in FIG. 4, the source of the fourth transistor MT6 is directly coupled to the gate of the fourth transistor MT6, so as to be equivalent to a diode. Thus, a node voltage at the third node N2 is controlled by the second signal Sn−1, while saving space of a DC voltage wiring. In the present embodiment, only the connection relationship with respect to the fourth transistor MT6 is changed, while constituent parts of the pixel circuit and a connection relation of other respective components remain unchanged. The connection relation of other components in the pixel circuit is described in detail through the above, and thus, will not be repeated herein.

According to the disclosure, there is also provided a light emitting display device, including:
  a pixel cell comprising multiple pixels and a pixel circuit of the pixels;
  a data driving element configured to supply a data signal to the pixels;
  a power supply element configured to supply a first pixel power supply, a second pixel power supply, a compensation power supply, and an initialization power supply to the pixels; and
  a scan driving element configured to selectively supply the data signal, the first pixel power supply, the second pixel power supply, the compensation power supply, and the initialization power supply to the pixels so as to enable a pixel current corresponding to the data signal to flow to the pixels;

The pixel circuit is already described in detail through the above embodiments, and thus, will not be repeated herein.

Exemplary embodiments of the present disclosure have been particularly illustrated and described as above. It is to be understood that the disclosure is not limited to the disclosed embodiments, but rather that the disclosure is intended to cover various modifications and equivalent permutations that are encompassed within the scope of the appended claims.

What is claimed is:

1. A pixel circuit, comprising:
  a light emitting component configured to emit light by receiving a pixel current flowing from a first pixel power supply to a second pixel power supply;
  a first transistor comprising a gate directly coupled to a first node, a first terminal coupled to the first pixel power supply and a second terminal coupled to a second node, the pixel current flowing from the first terminal to the second terminal and to the second node in response to a voltage at the gate;
  a second transistor configured to selectively provide a data signal directly to a third node;
  a third transistor configured to selectively couple the gate of the first transistor to the second terminal of the first transistor;
  a fourth transistor configured to selectively provide a compensation voltage to the first transistor;
  a fifth transistor configured to selectively provide an initialization voltage directly to the third node;
  a sixth transistor configured to selectively provide the pixel current at the second node to the light emitting component; and
  a capacitor comprising a first and second terminal, wherein the first terminal is directly connected to the first node and the second terminal is directly connected to the third node,
  wherein the third transistor comprises a first sub-transistor and a second sub-transistor, the first sub-transistor and the second sub-transistor each comprises a gate, a first terminal and a second terminal, the gate of the first sub-transistor and the gate of the second sub-transistor are directly coupled to a gate of the second transistor, the first terminal of the first sub-transistor is directly coupled to the first node, the second terminal of the first sub-transistor is directly coupled to the first terminal of the second sub-transistor, the second terminal of the second sub-transistor is directly coupled to the second node.

2. The pixel circuit according to claim 1, wherein turn-on and turn-off of the second transistor and turn-on and turn-off of the third transistor are determined by a first signal; turn-on and turn-off of the fourth transistor are determined by a second signal; and turn-on and turn-off of the fifth transistor and turn-on and turn-off of the sixth transistor are determined by a light emission control signal.

3. The pixel circuit according to claim 2, wherein the gate of the second transistor is coupled to a supply terminal of the first signal, and the second transistor further comprises:
  a first terminal coupled to a supply terminal of the data signal; and
  a second terminal coupled to the third node.

4. The pixel circuit according to claim 3, wherein the fourth transistor comprises:
  a gate coupled to a supply terminal of the second signal;
  a first terminal coupled to a terminal of a compensation power supply configured to supply the compensation voltage; and
  a second terminal coupled to the third node.

5. The pixel circuit according to claim 4, wherein the fifth transistor comprises:
  a gate coupled to a supply terminal of the light emission control signal;

a first terminal coupled to a terminal of an initialization power supply configured to supply the initialization voltage; and a second terminal coupled to the third node.

6. The pixel circuit according to claim 5, wherein the light emitting component comprises a light emitting diode having an anode and a cathode.

7. The pixel circuit according to claim 6, wherein the sixth transistor comprises:

a gate coupled to the supply terminal of the light emission control signal;

a first terminal coupled to the anode of the light emitting diode; and a second terminal coupled to the second node.

8. The pixel circuit according to claim 7, wherein the cathode of the light emitting diode is coupled to the second pixel power supply.

9. The pixel circuit according to claim 8, wherein the first transistor, the second transistor, the third transistor, the fourth transistor, the fifth transistor, and the sixth transistor are P-type transistors, and a driving timing of the pixel circuit comprises:

in a first time period, the first signal and the light emission control signal are at high level, and the second signal is at low level; the second transistor, the third transistor, the fifth transistor, and the sixth transistor are turned off, and the first transistor, and the fourth transistor are turned on;

in a second time period, the first signal is at low level, the second signal and the light emission control signal are at high level; the fourth transistor, the fifth transistor and the sixth transistor are turned off, and the first transistor, the second transistor, and the third transistor are turned on; and in a third time period, the first signal and the second signal are at high level, and the light emission control signal is at low level; the second transistor, the third transistor and the fourth transistor are turned off, and the first transistor, the fifth transistor, and the sixth transistor are turned on.

10. The pixel circuit according to claim 8, wherein the first transistor, the second transistor, the third transistor, the fourth transistor, the fifth transistor, and the sixth transistor are N-type transistors, and a driving timing of the pixel circuit comprises:

in a first time period, the first signal and the light emission control signal are at low level, and the second signal is at high level; the second transistor, the third transistor, the fifth transistor, and the sixth transistor are turned off, and the first transistor, the second transistor, and the fourth transistor are turned on;

in a second time period, the first signal is at high level, the second signal and the light emission control signal are at low level; the fourth transistor, the fifth transistor and the sixth transistor are turned off, and the first transistor, the second transistor, and the third transistor are turned on; and in a third time period, the first signal and the second signal are at low level, and the light emission control signal is at high level; the second transistor, the third transistor and the fourth transistor are turned off, and the first transistor, the fifth transistor, and the sixth transistor are turned on.

11. The pixel circuit according to claim 3, wherein the fourth transistor comprises:

a gate coupled to a supply terminal of the second signal;

a first terminal coupled to the supply terminal of the second signal; and a second terminal coupled to the third node.

12. A light emitting display device, comprising:

a pixel cell comprising multiple pixels and a pixel circuit of the pixels;

a data driving element configured to supply a data signal to the pixels;

a power supply element configured to supply a first pixel power supply, a second pixel power supply, a compensation power supply, and an initialization power supply to the pixels; and a scan driving element configured to selectively supply the data signal, the first pixel power supply, the second pixel power supply, the compensation power supply, and the initialization power supply to the pixels so as to enable a pixel current corresponding to the data signal to flow to the pixels;

wherein the pixel circuit comprises:

a light emitting component configured to emit light by receiving a pixel current flowing from a first pixel power supply to a second pixel power supply;

a first transistor comprising a gate directly coupled to a first node, a first terminal coupled to the first pixel power supply and a second terminal coupled to a second node, the pixel current flowing from the first terminal to the second terminal and to the second node in response to a voltage at the gate;

a second transistor configured to selectively provide a data signal directly to a third node;

a third transistor configured to selectively couple the gate of the first transistor to the second terminal of the first transistor;

a fourth transistor configured to selectively provide a compensation voltage to the first transistor;

a fifth transistor configured to selectively provide an initialization voltage directly to the third node;

a sixth transistor configured to selectively provide the pixel current at the second node to the light emitting component; and a capacitor comprising a first and second terminal, wherein the first terminal is directly connected to the first node and the second terminal is directly connected to the third node, wherein the third transistor comprises a first sub-transistor and a second sub-transistor, the first sub-transistor and the second sub-transistor each comprises a gate, a first terminal and a second terminal, the gate of the first sub-transistor and the gate of the second sub-transistor are directly coupled to a gate of the second transistor, the first terminal of the first sub-transistor is directly coupled to the first node, the second terminal of the first sub-transistor is directly coupled to the first terminal of the second sub-transistor, the second terminal of the second sub-transistor is directly coupled to the second node.

* * * * *